(12) United States Patent
Feng

(10) Patent No.: US 9,786,210 B2
(45) Date of Patent: Oct. 10, 2017

(54) PIXEL ARRAY COMPOSED OF PIXEL UNITS, DISPLAY AND METHOD FOR RENDERING IMAGE ON A DISPLAY

(71) Applicant: EverDisplay Optronics (Shanghai) Limited, Shanghai (CN)

(72) Inventor: Yuhsiung Feng, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/538,417

(22) Filed: Nov. 11, 2014

(65) Prior Publication Data

US 2015/0130868 A1 May 14, 2015

(30) Foreign Application Priority Data

Nov. 13, 2013 (CN) .......................... 2013 1 0566932

(51) Int. Cl.
G09G 3/20 (2006.01)
H01L 27/32 (2006.01)
G09G 3/3225 (2016.01)

(52) U.S. Cl.
CPC ......... *G09G 3/2003* (2013.01); *G09G 3/3225* (2013.01); *H01L 27/3218* (2013.01); *G09G 2300/0426* (2013.01); *G09G 2300/0452* (2013.01); *G09G 2300/0861* (2013.01);
(Continued)

(58) Field of Classification Search
None
See application file for complete search history.

(56) References Cited

U.S. PATENT DOCUMENTS

2007/0070267 A1 3/2007 Yang
2008/0231554 A1* 9/2008 Lee ..................... H01L 27/3218
345/63
(Continued)

FOREIGN PATENT DOCUMENTS

CN 101026185 A 8/2007
CN 101877357 A 11/2010
(Continued)

OTHER PUBLICATIONS

Office Action dated Jul. 28, 2015 by the TW Office.
Office Action dated Sep. 11, 2015 by the JP Office.
Office Action dated Jul. 3, 2015, 2015 by the CN Office.

*Primary Examiner* — David D Davis
(74) *Attorney, Agent, or Firm* — Yunling Ren

(57) ABSTRACT

A pixel array composes of a plurality of basic pixel units arranged in row and column directions. Each of the basic pixel units consists of a first sub-pixel group composed of two adjacent first sub-pixel having a first color, a second sub-pixel group composed of two adjacent second sub-pixels having a second color, and two third sub-pixel groups, each of which is composed of two adjacent third sub-pixels having a third color. The distance between the two adjacent first, second, third sub-pixels, in row or column direction is smaller than a first predetermined value. The two adjacent third sub-pixel groups are arranged at a first row, and located at a first, third columns respectively, and the first, second sub-pixel group are arranged at a second row, wherein, the first sub-pixel group is located at a second column, and the other is located at a fourth column.

11 Claims, 17 Drawing Sheets

(52) U.S. Cl.
CPC . *G09G 2320/0666* (2013.01); *G09G 2340/06* (2013.01); *G09G 2360/16* (2013.01)

(56) References Cited

U.S. PATENT DOCUMENTS

| | | | | |
|---|---|---|---|---|
| 2008/0252558 | A1* | 10/2008 | Kim | G09G 3/2003 345/55 |
| 2010/0007723 | A1* | 1/2010 | Yasui | G09G 3/003 348/59 |
| 2011/0012820 | A1* | 1/2011 | Kim | G09G 3/3208 345/82 |
| 2011/0025669 | A1* | 2/2011 | Kwak | G09G 3/3225 345/211 |
| 2011/0291550 | A1* | 12/2011 | Kim | G09G 3/2003 313/504 |
| 2013/0021328 | A1 | 1/2013 | Yang et al. | |
| 2013/0027437 | A1 | 1/2013 | Gu | |
| 2013/0155034 | A1* | 6/2013 | Nakayama | G09F 9/35 345/204 |

FOREIGN PATENT DOCUMENTS

| | | |
|---|---|---|
| CN | 102262854 A | 11/2011 |
| CN | 103067672 A | 4/2013 |
| CN | 103325315 A | 9/2013 |
| JP | 60120398 | 6/1985 |
| JP | 3269567 | 12/1991 |
| JP | 2004117431 | 4/2004 |
| JP | 2005345766 | 12/2005 |
| JP | 2008209902 | 9/2008 |
| JP | 2009300748 | 12/2009 |
| JP | 2010262920 | 11/2010 |
| JP | 2011187441 | 9/2011 |
| JP | 201228170 | 9/2012 |
| JP | 201358323 | 3/2013 |
| JP | 201397371 | 5/2013 |

* cited by examiner

PIXEL ARRAY COMPOSED OF PIXEL UNITS, DISPLAY AND METHOD FOR RENDERING IMAGE ON A DISPLAY

CROSS-REFERENCE TO RELATED APPLICATIONS

This application claims the benefits to Chinese Patent Application No. 201310566932.8, filed on Nov. 13, 2013 in the Patent Office of China, the disclosure of which is incorporated herein by reference in its entirety.

TECHNICAL FIELD

The present disclosure relates in general to a display device and, in particular, to a pixel array, a method for rendering image on a display and a display with this pixel array.

BACKGROUND

Active matrix organic light emitting diode (AMOLED) is a new generation of displays. FIG. 1(a) to FIG. 1(e) are the schematic diagrams of various pixel arrays in conventional AMOLED displays.

Pixel arrays of the conventional AMOLED tend to use PenTile-like arrangements. However, the pixel array arrangement of PenTile or non-typical PenTile will cause coarse edges of the image.

The pixel unit of conventional pixel arrays is composed of a red, green and blue sub-pixels, while the PenTile pixel array has different pixels (or called pixel unit), one of them is red-green, and the other is blue-green. As well known, only three primary colors can compose all colors, but two colors cannot compose all colors. So when rendering an image, one pixel unit of PenTile will "borrow" the other color from its adjacent pixel unit to compose the three primary colors. In the row direction, every pixel unit shares a sub-pixel of which the color is absent in the sub-pixel with an adjacent pixel unit, to realize the effect of white displaying jointly. As shown in FIG. 1(b), in every sub-pixel row, two adjacent sub-pixels compose a pixel. When borrowing sub-pixels, the pixel unit may borrow the most adjacent sub-pixel needed on the dotted line in FIG. 1(b).

Conventional AMOLEDs meet a bottleneck in high resolution products. As the current mainstream evaporation technique for AMOLED is FMM (Fine Metal Mask), the products with the evaporation resolution over 200 PPI tend to have a problem of color mixture (i.e. low yield of production) for normal pixel arrangement (a stripe arrangement).

Thus a pixel arrangement for rendering like non-typical PenTile, etc., is derived, which can save one third of the sub-pixels, to solve the problem of low accuracy of evaporation of FMM. However, the arrangement of PenTile is different from the actual RGB sub-pixels after all. Due to the sharing of the sub-pixel, PenTile will cause blurring edges at discontinuous parts in a image.

The above information disclosed in this Background section is only for enhancement of understanding of the background of the disclosure and therefore it may contain information that does not form the prior art that is already known in this country to a person of ordinary skill in the art.

SUMMARY OF THE INVENTION

One aspect of the present disclosure provides a pixel array composed of a plurality of basic pixel units arranged in row and column directions. wherein, each of the basic pixel units consists of a first sub-pixel group, a second sub-pixel group and two third sub-pixel groups. The first sub-pixel group composed of two adjacent first sub-pixels, wherein each of the two adjacent first sub-pixels has a first color, and distance between the two adjacent first sub-pixels in row or column direction is smaller than a first predetermined value; The second sub-pixel group composed of two adjacent second sub-pixels, wherein, each of the two adjacent second sub-pixels has a second color, and distance between the two adjacent second sub-pixels in row or column direction is smaller than the first predetermined value. Each of the two third sub-pixel groups is composed of two adjacent third sub-pixels, wherein, each of the two adjacent third sub-pixels has a third color, and distance between the two adjacent third sub-pixels in row or column direction is smaller than the first predetermined value. wherein, the two adjacent third sub-pixel groups are arranged at a first row, the first of the two adjacent third sub-pixel groups is located at a first column, and the other is located at a third column; and the first sub-pixel group and the second sub-pixel group are arranged at a second row, wherein, the first sub-pixel group is located at a second column, and the other is located at a fourth column.

According to an embodiment, a plurality of basic pixel units align in row and column to compose the pixel array.

According to an embodiment, a interval between two corresponding third sub-pixel group of two adjacent basic pixel units in row direction is smaller than or equal to a combination of widths of the first, the second and the third sub-pixels.

According to an embodiment, a interval between two corresponding third sub-pixel groups of two adjacent basic pixel units in column direction is larger than or equal to either height of the first sub-pixel group and the second sub-pixel group.

According to an embodiment, each of the basic pixel units comprises: a row comprising the first sub-pixel group, one of the third sub-pixel groups, the second sub-pixel group and another one of the third sub-pixel groups in sequence from left to right.

According to an embodiment, an interval between adjacent sub-pixel groups in row direction is larger than or equal to zero.

According to an embodiment, adjacent basic pixel units in row direction are aligned with each other, and adjacent basic pixel units in column direction are offset from each other with half width of one basic pixel unit.

According to an embodiment, an interval between two corresponding third sub-pixel group of two adjacent basic pixel units in row direction is larger than or equal to a combination of widths of the first, the second and the third sub-pixels.

According to an embodiment, an interval between two sub-pixel groups, which are aligned in column direction of the pixel array, is larger than or equal to zero.

According to an embodiment, an interval between any two adjacent sub-pixel groups of the basic pixel unit in row direction or in column direction is not less than zero.

According to an embodiment, two adjacent basic pixel units are aligned with each other in row or column direction.

According to an embodiment, an interval between two corresponding third sub-pixel groups of two adjacent basic pixel units in row direction is larger than or equal to a width of the third sub-pixel.

According to an embodiment, an interval between two corresponding third sub-pixel groups of two adjacent basic pixel units in column direction is larger than or equal to either height of the first sub-pixel group and the third sub-pixel group.

According to an embodiment, the first predetermined value is 10 µm.

According to an embodiment, the two first sub-pixels composing the first sub-pixel group are aligned with each other in column direction; the two second sub-pixels composing the second sub-pixel group are aligned with each other in column direction; and the two third sub-pixels composing the third sub-pixel group are aligned with each other in column direction.

According to an embodiment, the first sub-pixel, the second sub-pixel or the third sub-pixel has a rectangular shape, a circular shape, a rhombus shape or a regular hexagonal shape.

According to an embodiment, an interval in row direction between two sub-pixel groups which are respectively located at corresponding locations in two adjacent basic pixel units in the row direction of the pixel array, is smaller than or equal to the width of three sub-pixels.

According to an embodiment, an interval in column direction between two sub-pixel groups which are respectively located at corresponding locations in two adjacent basic pixel units in column direction of the pixel array, is larger than or equal to a height of two sub-pixels.

According to an embodiment, each of the basic pixel units comprises: a row comprising the first sub-pixel group, one of the third sub-pixel groups, the second sub-pixel group and another one of the third sub-pixel groups in order from left to right.

According to an embodiment, the interval in row direction between adjacent sub-pixel groups is larger than or equal to zero.

According to an embodiment, the plurality of basic pixel units are aligned with each other in row direction, and are offset from each other with half width of one basic pixel unit in column direction to compose the pixel array.

According to an embodiment, an interval in row direction between two sub-pixel groups which are respectively located at corresponding locations in two adjacent basic pixel units in the row direction of the pixel array, is larger than or equal to the width of three sub-pixels.

According to an embodiment, an interval in column direction between two sub-pixel groups, which are aligned in column direction of the pixel array, is larger than or equal to zero.

According to an embodiment, a distance between any two adjacent sub-pixel groups in row direction or in column direction is not less than zero.

According to an embodiment, two adjacent basic pixel units in row or column direction are aligned with each other.

According to an embodiment, an interval in row direction between two sub-pixel groups, which are respectively located at corresponding locations in two adjacent basic pixel units in the row direction of the pixel array, is larger than or equal to a width of one sub-pixel.

According to an embodiment, an interval in column direction between two sub-pixel groups, which are respectively located at corresponding locations in two adjacent basic pixel units in the column direction of the pixel array, is larger than or equal to a height of one sub-pixel.

According to an embodiment, the first predetermined value is 10 µm.

According to an embodiment, the two first sub-pixels composing the first sub-pixel group are aligned with each other in column direction; the two second sub-pixels composing the second sub-pixel group are aligned with each other in column direction; and the two third sub-pixels composing the third sub-pixel group are aligned with each other in column direction.

According to an embodiment, the first sub-pixel, the second sub-pixel or the third sub-pixel has a rectangle shape, a circle shape, a rhombus shape or a regular hexagon shape.

According to an embodiment, the first color, the second color and the third color are blue, red and green, respectively.

According to an embodiment, the row composed of sub-pixels with a same color in the pixel array is provided with signals from a scanning driver, and the column composed of sub-pixels with different colors is provided with signals from a data driver.

Another aspect of the present disclosure provides a display including a substrate, a pixel array, a driver, a sub-pixel painting unit, and an output unit. The substrate has a pixel region and a non-pixel region; The pixel array is located in the pixel region, wherein the pixel array is composed of a plurality of basic pixel units arranged in row and column directions. Each of the basic pixel units includes, a first sub-pixel group, a second sub-pixel group, and two third sub-pixel groups. The first sub-pixel group is composed of two adjacent first sub-pixels, wherein each of the two adjacent first sub-pixels has a first color, and distance between the two adjacent first sub-pixels in row or column direction is smaller than a first predetermined value; The second sub-pixel group is composed of two adjacent second sub-pixels, wherein, each of the two adjacent second sub-pixels has a second color, and distance between the two adjacent second sub-pixels in row or column direction is smaller than the first predetermined value; Each of the third sub-pixel group is composed of two adjacent third sub-pixels, wherein, each of the two adjacent third sub-pixels has a third color, and distance between the two adjacent third sub-pixels in row or column direction is smaller than the first predetermined value. Wherein each of the sub-pixels includes an organic light emitting diode, the organic light emitting diode comprising a first electrode, an organic film and a second electrode; The driver is configured to drive the organic light emitting diode, the drive includes an input unit configured to input an image signal which represents a color image to be rendered on the display; The sub-pixel painting unit is configured to generate an intensity map which includes intensity values of each of the first sub-pixels, the second sub-pixels and the third sub-pixels of the display; The output unit is configured to output a plurality of electrical signals generated according to the intensity map to the pixel array.

According to an embodiment, the driver further comprises: a luminance mapping unit configured to receive the color image from the input unit and generate a luminance map of the color image, wherein the luminance map comprises luminance values of each of the first sub-pixel, the second sub-pixels and the third sub-pixels; and a pattern estimation unit electrically connected between the luminance mapping unit and the sub-pixel painting unit and configured to analyze the luminance map to estimate at least one pattern of the color image and generate at least one color template for each pattern.

According to an embodiment, the driver further comprises: a luminance buffer electrically connected between the sub-pixel painting unit and the output unit and configured to receive and buffer the intensity map output from the sub-pixel painting unit.

According to an embodiment, the at least one pattern comprises a dot pattern, and wherein a color template corresponding to the dot pattern comprises: a first sub-pixel at a center of the color template corresponding to the dot pattern and having a first luminance value; a second sub-pixel adjacent to the first sub-pixel in row direction and having a second luminance value; and a third sub-pixel adjacent to the first sub-pixel in column direction and having a third luminance value.

According to an embodiment, the at least one pattern comprises a dot pattern, and wherein a color template corresponding to the dot pattern comprises: a first sub-pixel at a center of the color template corresponding to the dot pattern and having a first luminance value; a third sub-pixel adjacent to the first sub-pixel in row direction and having a third luminance value; and a second sub-pixel adjacent to the first sub-pixel in row direction and having a second luminance value.

According to an embodiment, the at least one pattern comprises a dot pattern, and wherein the color template corresponding to the dot pattern comprises: a first sub-pixel at a center of the color template corresponding to the dot pattern and having a first luminance value; a third sub-pixel adjacent to the first sub-pixel in column direction and having a third luminance value; and a second sub-pixel adjacent to the first sub-pixel in column direction and having a second luminance value.

According to an embodiment, the first sub-pixel and the third sub-pixel compose one pixel.

According to an embodiment, the first sub-pixel and the third sub-pixel compose one pixel.

According to an embodiment, the first sub-pixel and the third sub-pixel compose one pixel.

A further aspect of the present disclosure provides a method for rendering an image on a display, the display comprising a pixel array composed of a plurality of basic pixel units repeated in row and column directions, each of the basic pixel units comprising: a first sub-pixel group composed of two adjacent first sub-pixels, wherein the first sub-pixel has a first color, and the distance between the two adjacent first sub-pixels in row or column directions is smaller than a first predetermined value; a second sub-pixel group composed of two adjacent second sub-pixels, wherein, the second sub-pixel has a second color, and the distance between the two second sub-pixels in row or column directions is smaller than the first predetermined value; and two third sub-pixel groups, each of which is composed of two adjacent third sub-pixels, wherein, the third sub-pixel has a third color, and the distance between the two third sub-pixels in row or column directions is smaller than the first predetermined value, the method comprising: (a) inputting image signals representative of a color image to be rendered on the display; (b) generating an intensity map which comprises intensity values of each of the first sub-pixels, the second sub-pixels and the third sub-pixels of the display; and (c) outputting a plurality of electrical signals generated according to the intensity map to the display.

According to an embodiment, after step (a) and before step (b), the method further comprises: generating a luminance map of the color image, wherein the luminance map comprises luminance values of the first sub-pixels, the second sub-pixels and the third sub-pixels; and analyzing the luminance map to estimate at least one pattern of the color image and generating at least one color template for each pattern, wherein the at least one color template is used to generate the intensity map.

According to an embodiment, after step (b) and before step (c), the method further comprises: receiving and buffering the intensity map.

According to an embodiment, the at least one pattern comprises a dot pattern, and wherein the color template corresponding to the dot pattern comprises: a first sub-pixel at a center of the color template corresponding to the dot pattern and having a first luminance value; a second sub-pixel adjacent to the first sub-pixel in row direction and having a second luminance value; and a third sub-pixel adjacent to the first sub-pixel in column direction and having a third luminance value.

According to an embodiment, the at least one pattern comprises a dot pattern, and wherein the color template corresponding to the dot pattern comprises: a first sub-pixel at a center of the color template corresponding to the dot pattern and having a first luminance value; a third sub-pixel adjacent to the first sub-pixel in row direction and having a third luminance value; and a second sub-pixel adjacent to the first sub-pixel in row direction and having a second luminance value.

According to an embodiment, the at least one pattern comprises a dot pattern, and wherein the color template corresponding to the dot pattern comprises: a first sub-pixel at a center of the color template corresponding to the dot pattern and having a first luminance value; a third sub-pixel adjacent to the first sub-pixel in column direction and having a third luminance value; and a second sub-pixel adjacent to the first sub-pixel in column direction and having a second luminance value.

According to an embodiment, the first sub-pixel and the third sub-pixel compose one pixel.

According to an embodiment, the first sub-pixel and the third sub-pixel compose one pixel.

According to an embodiment, the first sub-pixel and the third sub-pixel compose one pixel.

BRIEF DESCRIPTION OF THE DRAWINGS

The foregoing and other features and advantages of the disclosure will be apparent to those skilled in the art in view of the following detailed description, taken in conjunction with the accompanying drawings.

Figure 1A:
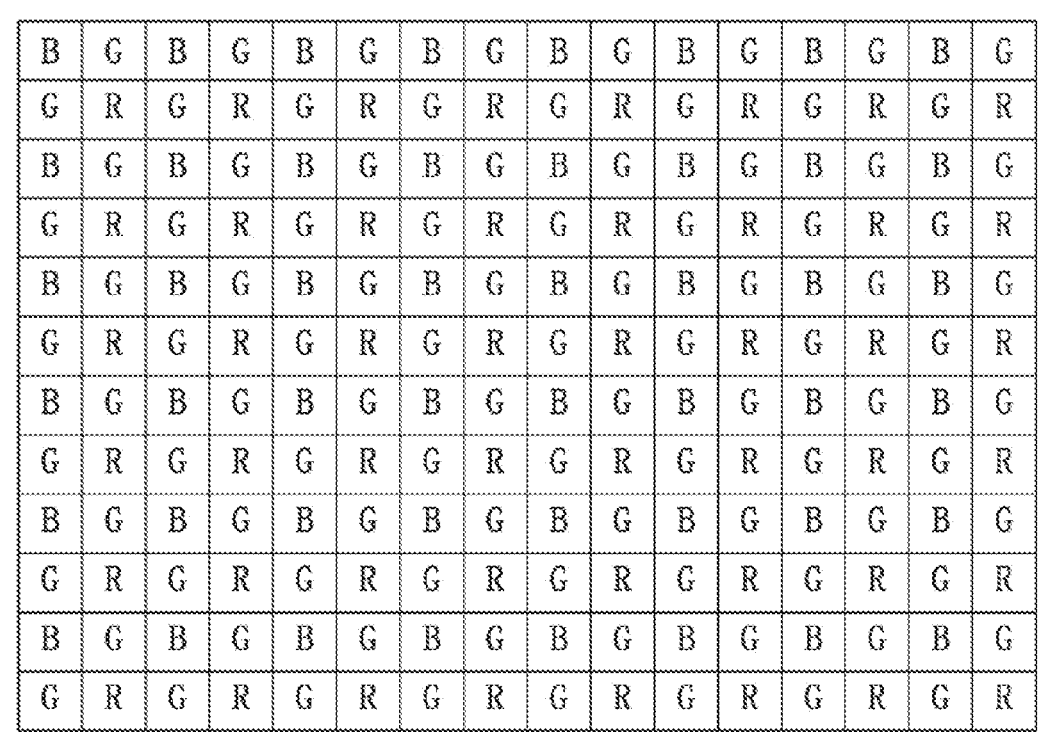
Figure 1B:
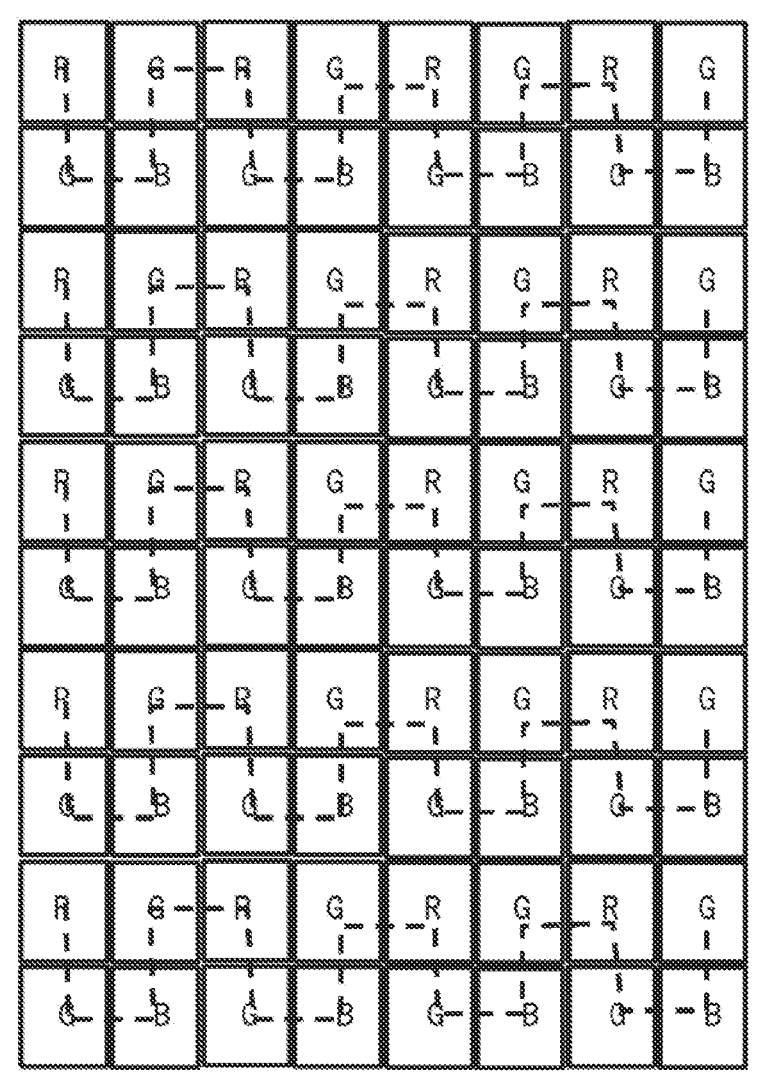

FIG. 1(a) to FIG. 1(e) illustrates schematic diagrams of various conventional pixel arrays.

DETAILED DESCRIPTION

Figure 1C:
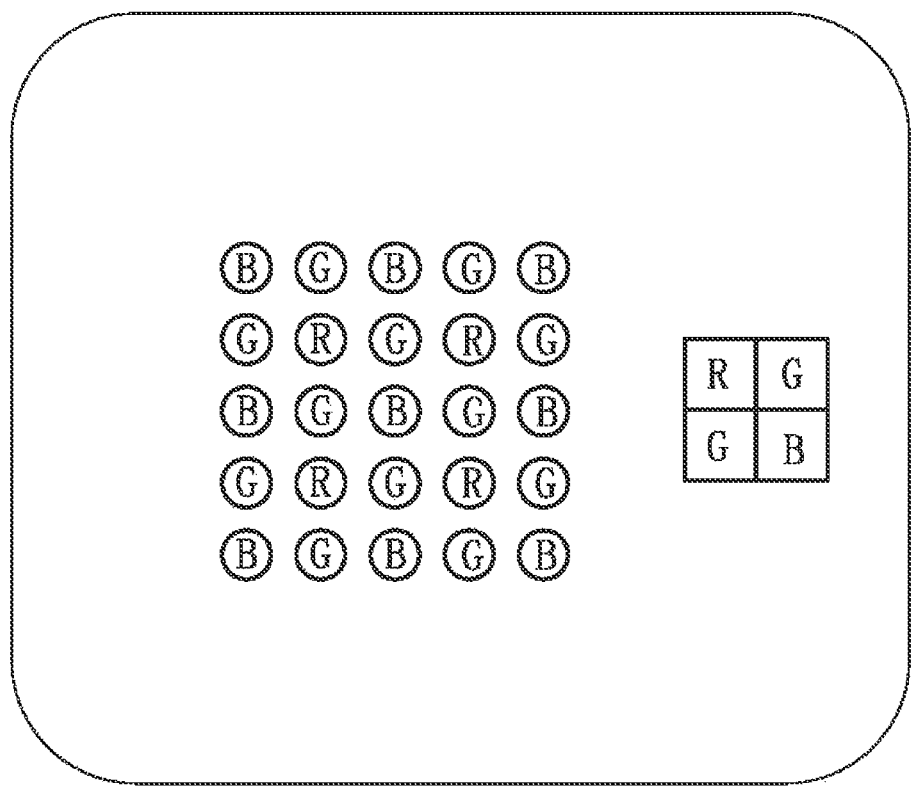
Figure 1D:
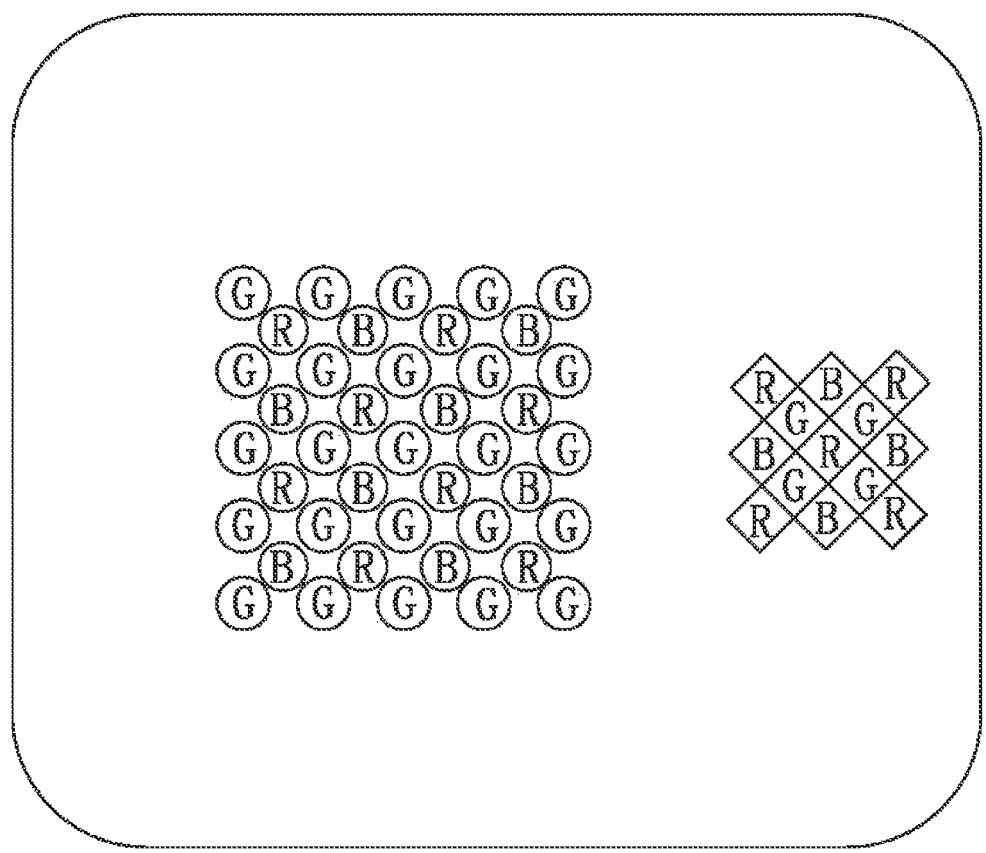
Figure 1E:
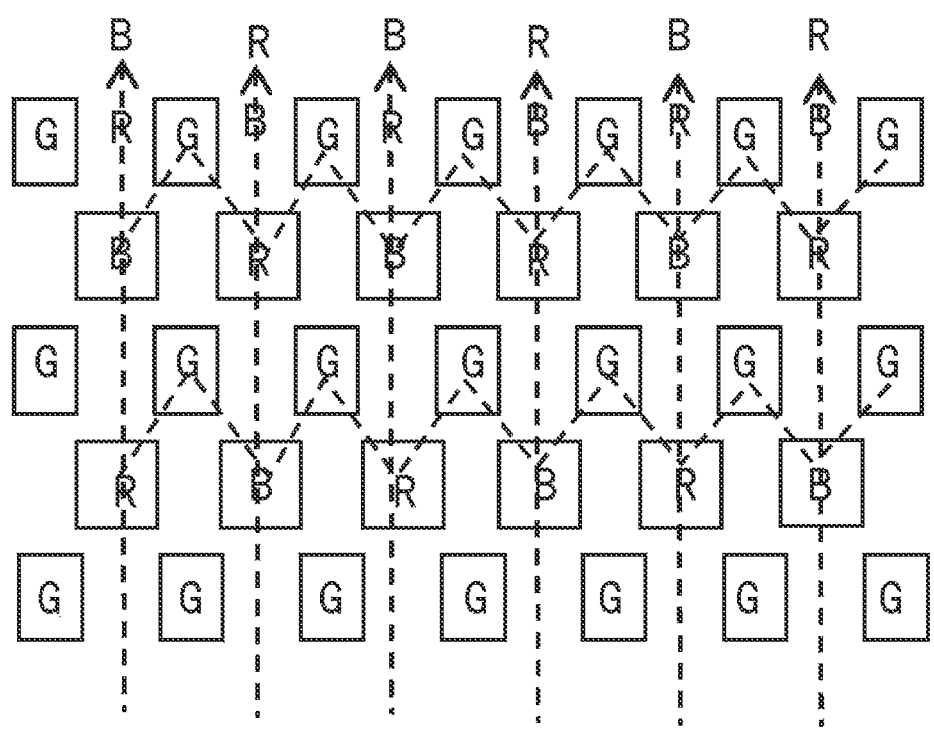

Exemplary embodiments of the disclosure will now be described more fully with reference to the accompanying drawings, in which exemplary embodiments are shown. Exemplary embodiments of the disclosure may, however, be embodied in many different composes and should not be construed as being limited to the embodiments set forth herein; rather, these embodiments are provided so that this disclosure will be thorough and complete, and will fully convey the concept of exemplary embodiments to those skilled in the art. In the drawings, the thicknesses of layers and regions are exaggerated for clarity. Like reference numerals in the drawings denote like elements, and thus their description will be omitted.

The described features, structures, or/and characteristics of the disclosure may be combined in any suitable manner in one or more embodiments. In the following description, numerous specific details are disclosed to provide a thorough understanding of embodiments of the disclosure. One skilled in the relevant art will recognize, however, that the disclosure may be practiced without one or more of the specific details, or with other methods, components, materials, and so forth. In other instances, well-known structures, materials, or operations are not shown or described in detail to avoid obscuring aspects of the disclosure.

The pixel arrays of the embodiments of the disclosure can be applied to the displays of the embodiments of the disclosure. The displays of the embodiments of the disclosure have the pixel arrays of the embodiments of the disclosure. The displaying methods (or called rendering method) of the embodiments of the disclosure can be used in the displays of the embodiments of the disclosure. According to an embodiment, the displays of the embodiments of the disclosure are the displays of mobile phones; more According to an embodiment, they are AMOLED displays used in mobile phones.

Figure 2:
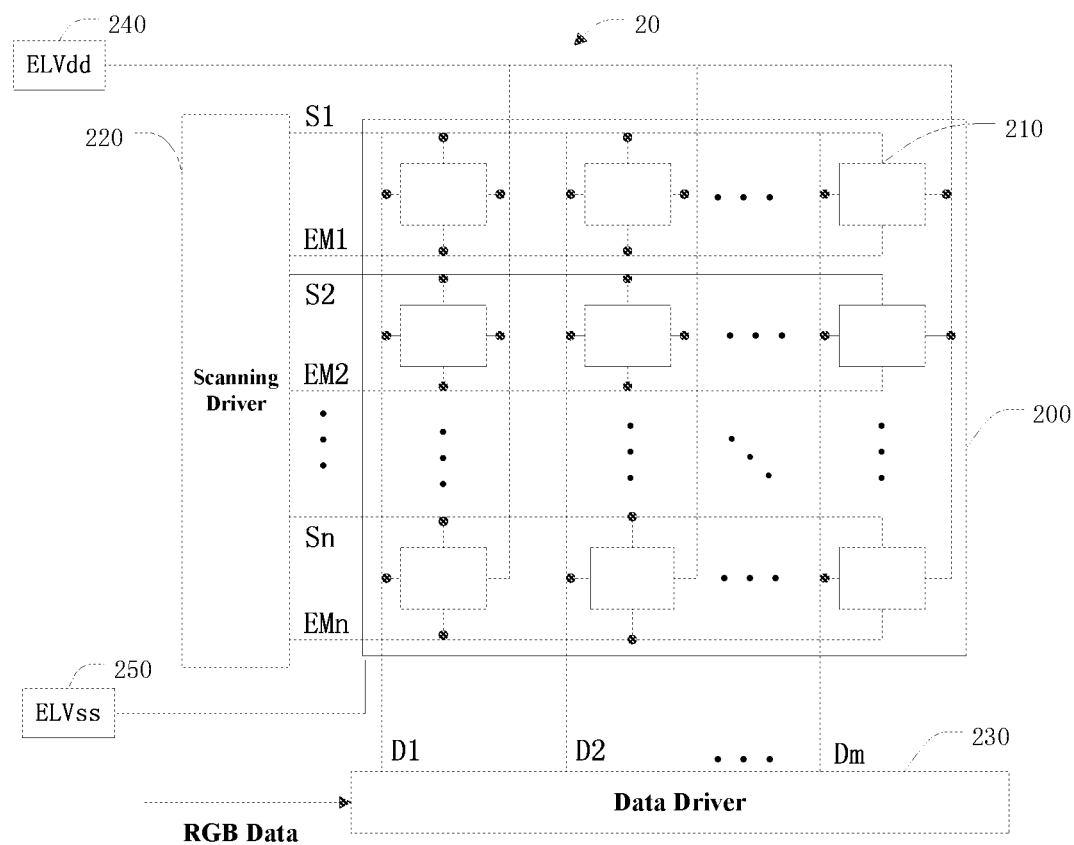
FIG. 2 illustrates a schematic diagram of the display device according to the disclosure.

FIG. 2 is a schematic diagram of the displaying device of the disclosure. The displaying device is an OLED displaying device 20. Referring to FIG. 2, the OLED displaying device 20 comprises at least a displaying unit 200, a scanning driver 220 and a data driver 230. The OLED displaying device 20 can also comprise other devices and/or components.

The displaying unit 200 can comprise a plurality of pixels 210 connecting to scanning lines (S1 to Sn), emission control lines (EM1 to EMn) and data lines (D1 to Dm). Moreover, one of the pixels 210 can have an OLED, and can be composed of two sub-pixels which emit lights of different colors, e.g. red and green, red and blue, or green and blue.

The displaying unit 200 can display an image to correspond to an external first power source 240 (ELVdd) and an external second power source 250 (ELVss). The displaying unit 200 can also display images corresponding to the scanning signals provided through the scanning lines S1 to Sn and the emission control signals provided through the emission control lines EM1 to EMn, which are generated by the scanning driver 220, and the data signals provided through the data lines E1 to Em generated by the data driver 230.

The scanning driver 220 can generate the scanning signals and the emission control signals. The scanning signals generated in the scanning driver 220 can be provided to the scanning lines (S1 to Sn) in turn, and the emission control signals generated in the scanning driver 220 can be provided to each one of the emission control lines (EM1 to EMn) in turn. The scanning signals and the emission control signals can also be respectively provided to the scanning lines S1 to Sn and the emission control lines EM1 to EMn out of turn. In others embodiments, the emission control signals can also be generated by an emission control driver.

The data driver 230 can receive an input signal, e.g. RGB data, and generate a data signal corresponding to the received input signal. The data signals generated in the data driver 230 can be provided to the pixels 210 through the data lines (D1 to Dm), to synchronize with the scanning signals. The data signals can also be provided to the data lines D1 to Dm in an asynchronous manner with the scanning signals.

Actually, in the pixel array according to the embodiments of the disclosure, one pixel 210 is represented by two sub-pixels. The pixel array will be illustrated in detail with reference to FIG. 3(a)-FIG. 5(c).

Figure 3A:
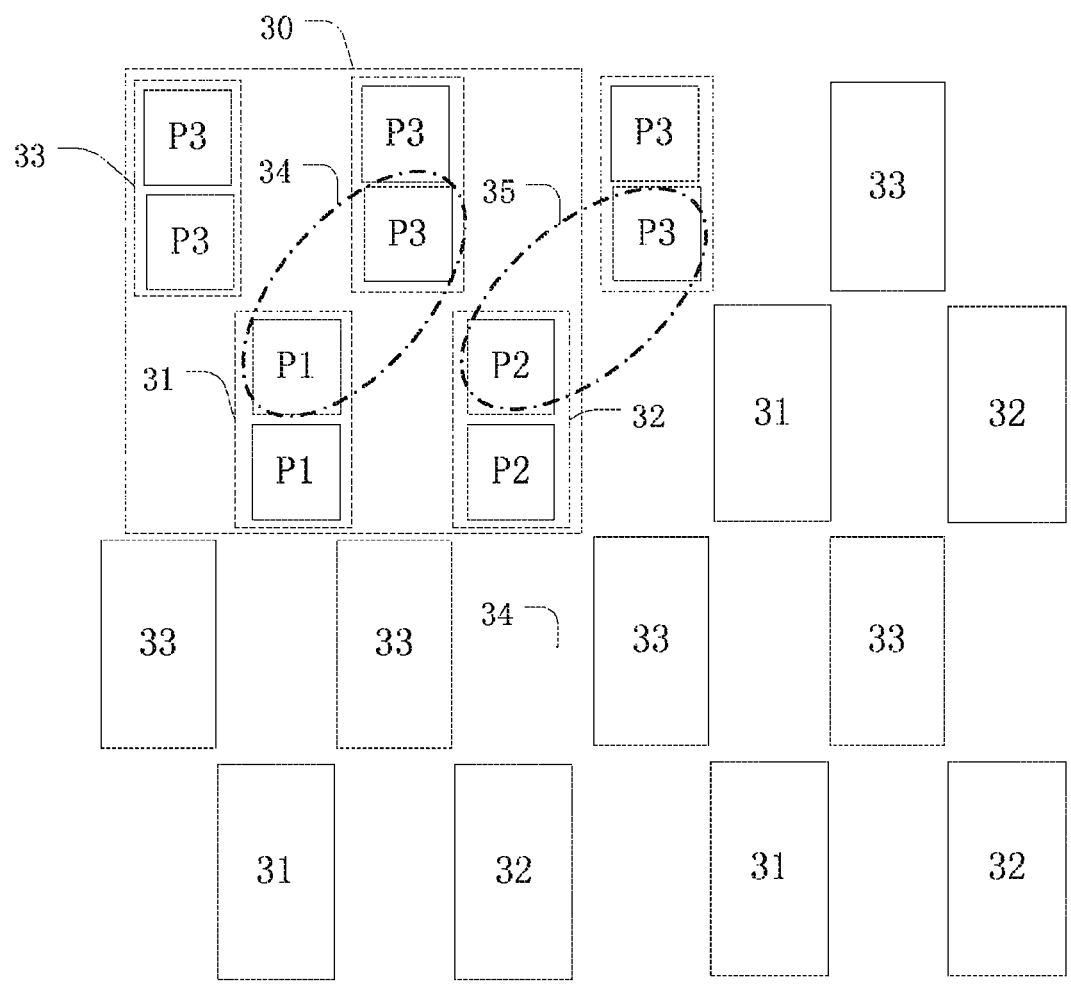
FIG. 3(a) illustrates a schematic diagram of the pixel array according to an exemplary embodiment of the disclosure.

FIG. 3(a) illustrates a schematic diagram of the pixel array according to an exemplary embodiment of the disclosure. As shown in FIG. 3(a), the pixel array is composed of a plurality of basic pixel units 30 repeated in row and column directions. Each of the basic pixel units 30 includes a first sub-pixel group 31, a second sub-pixel group 32 and two third sub-pixel groups 33.

The first sub-pixel group 31 is composed of two first sub-pixels P1. The two first sub-pixels P1 have a first color. The distance between the two first sub-pixels P1 in row or column direction is smaller than a first predetermined value. In detail, it is that the distance between contour lines encircling two adjacent first sub-pixels P1 which compose a first sub-pixel group 31 is smaller than the first predetermined value. According to an embodiment, two first sub-pixels P1 which compose a first sub-pixel group 31 are aligned in column direction.

The second sub-pixel group 32 is composed of two second sub-pixels P2. The two second sub-pixels P2 have a second color. The distance between the two second sub-pixels P2 in row or column direction is smaller than the first predetermined value. In detail, it is that the distance between contour lines encircling two adjacent second sub-pixels P2 which compose a second sub-pixel group 32 is smaller than the first predetermined value. According to an embodiment, two second sub-pixels P2 which compose a second sub-pixel group 32 align in column direction.

Each of the two third sub-pixel groups 33 is composed of two third sub-pixels P3. The two third sub-pixels P3 have a third color. The distance between the two third sub-pixels P3 in row or column direction is smaller than the first predetermined value. In detail, it is that the distance between contour lines encircling two adjacent third sub-pixels P3 which compose a third sub-pixel group 33 is smaller than the first predetermined value. According to an embodiment, two third sub-pixels P3 which compose a third sub-pixel group 33 align in column direction.

For example, the first predetermined value is 10 μm in this embodiment, while in conventional manufacturing process, the distance between sub-pixels with the same color is 56 μm and the distance between sub-pixels with different colors is 26 μm. The first color, the second color and the third color are one of blue, red and green, respectively.

The basic pixel unit 30 includes from top to bottom: the first row composed of two third sub-pixel groups 33 from left to right, wherein, the first third sub-pixel group 33 counted from left is located at the first column of the basic pixel unit 30, and the second third sub-pixel group 33 counted from left is located at the third column of the basic pixel unit 30; and the second row composed of a first sub-pixel group 31 and a second sub-pixel group 32 from left to right, wherein, the first sub-pixel group 31 is located at the second column of the basic pixel unit 30, and the second sub-pixel group 32 is located at the fourth column of the basic pixel unit 30. The first row is offset from the second row in column directions at a distance equal to or smaller than the width of one sub-pixel (although the staggering distance shown in the figure is larger than the width of one sub-pixel). The first column is aligned with the third column in row direction, and the second column is aligned with the fourth column in row direction. In row direction, the second column and the fourth column are offset from the first column and the third column at distance equal to or larger than the height of two sub-pixels. In detail, the above rows and columns are based on the sub-pixel group as a unit. an interval between the first of the two third sub-pixel groups and the first sub-pixel group in column direction is larger than or equal to zero.

According to an embodiment, the distance between two adjacent third sub-pixel groups 33 in row direction, or the distance between one first sub-pixel group 31 and one second sub-pixel group 32 which are adjacent to each other in row direction, are smaller than or equal to the width of a sub-pixel.

According to an embodiment, the basic pixel units 30 align in both row and column directions to compose a pixel array. The interval in row direction between two sub-pixel groups which are respectively located at the corresponding locations in two adjacent basic pixel units 30 in row direction of the pixel array, is smaller than or equal to the width of three sub-pixels. The interval in column direction between two sub-pixel groups which are respectively located at the corresponding locations in two adjacent basic pixel units 30 in column direction of the pixel array, is larger than or equal to the height of one sub-pixel.

In detail, the third sub-pixel P3 closer to the second row in the second of the third sub-pixel groups 33 counted from left in the first row, and the first sub-pixel P1 closer to the first row in the first of the first sub-pixel groups 31 in the second row, compose one first pixel 34 jointly; the third sub-pixel P3 closer to the second row in the third of third sub-pixel groups 33 counted from left in the first row, and the second sub-pixel P2 closer to the first row in the first of the second sub-pixel groups 32 counted from left in the second row, compose one second pixel 35 jointly, and so on. In addition, the third sub-pixel P3 closer to the second row in the first of third sub-pixel groups 33 counted from left in the first row, and the first sub-pixel P1 closer to the first row in the first of the first sub-pixel groups 31 counted from left in the second row, compose one second pixel jointly; the third sub-pixel P3 closer to the second row in the second of third sub-pixel groups 33 counted from left in the first row, and the second sub-pixel P2 closer to the first row in the first of the second sub-pixel groups 32 counted from left in the second row, compose one second pixel 35 jointly, and so on. The above-mentioned pixels correspond to pixels 210 as shown in FIG. 2. Since three primary colors can generate all colors, while two colors cannot form all colors, when an image is actually displayed, one pixel may "borrow" the other color from its adjacent pixel group to compose three primary colors. If scanning is performed by row from top to bottom a first pixel 34 may borrow a second sub-pixel P2 from its adjacent second pixel 35 in row direction due to lack of a second sub-pixel. Thus, each pixel shares a sub-pixel of which the color is absent in said pixel with its adjacent pixel in row direction, to realize the white displaying effect jointly.

FIG. 3(*b*) illustrates a schematic diagram of the pixel array according to an exemplary embodiment of the disclosure. As shown in FIG. 3(*b*), the pixel array is composed of basic pixel units 30' repeated in row and column direction. Each of basic pixel units includes: a first sub-pixel group 31', a second sub-pixel group 32' and two third sub-pixel groups 33'.

A first sub-pixel group 31' is composed by two blue sub-pixels B, and the distance between the two blue sub-pixels B in row direction or column direction is smaller than the first predetermined value. In detail, it is that the distance between the contour lines surrounding two adjacent blue sub-pixels B21*i* and B21*j* which compose a first sub-pixel group 31' is smaller than the first predetermined value. According to an embodiment, two blue sub-pixels B which compose a first sub-pixel group 31' are aligned in column direction.

A second sub-pixel group 32' is composed of two red sub-pixels R, and the distance between the two red sub-pixels R in row direction or column direction is smaller than the first predetermined value. In detail, it is that the distance between the contour lines surrounding two adjacent red sub-pixels R22*i* and R22*j* which compose a second sub-pixel group 32' is smaller than the first predetermined value. According to an embodiment, two red sub-pixels R which compose a second sub-pixel group 32' are aligned in column direction.

Each of the two third sub-pixel groups 33' is composed of two green sub-pixels G, and the distance between the two green sub-pixels G in row direction or column direction is smaller than the first predetermined value. In detail, it is that the distance between the contour lines surrounding two adjacent green sub-pixels G11*i* and G11*j* which compose a third sub-pixel group 33' is smaller than the first predetermined value. According to an embodiment, two green sub-pixels B which compose a third sub-pixel group 33' are aligned in column direction.

For example, the first predetermined value is 10 μm in this embodiment, while in conventional manufacturing process, the distance between sub-pixels with the same color is 56 μm and the distance between sub-pixels with different colors is 26 μm.

For example, the blue sub-pixels B as the first sub-pixel with the first color compose a first sub-pixel group 31', the red sub-pixels R as the second sub-pixel with the second color compose a second sub-pixel group 32', and the green sub-pixels G as the third sub-pixel with the third color compose a third sub-pixel group 33'. The arrangement of the pixel array shown in FIG. 3(*b*) is similar to that of the pixel array shown in FIG. 3(*a*), which is not described herein for conciseness.

More particularly, the green sub-pixel G12*j* closer to the second row in the second of the third sub-pixel groups 33' counted from left in the first row, and the blue sub-pixel B21*i* closer to the first row in the first of the first sub-pixel groups 31' counted from left in the second row, compose one first pixel 34' jointly; the green sub-pixel G13*j* closer to the second row in the third of the third sub-pixel groups 33' counted from left in the first row, and the red sub-pixel R22*i* closer to the first row in the first of the second sub-pixel groups 32' counted from left in the second row, compose one second pixel 35' jointly. Moreover, the blue sub-pixel B21j and the red sub-pixel R22j compose pixels respectively with their right adjacent green sub-pixels in the next row, and so on. The above-mentioned pixels correspond to the pixels 210 as shown in FIG. 2. Since three primary colors can generate all colors, while two colors cannot generate all colors, when an image is actually displayed, one pixel may "borrow" the other color from its adjacent pixel group to compose three primary colors. If scanning is performed by row from top to bottom, the first pixel 34' can borrow the second sub-pixel R22i from its adjacent second pixel 35' in row direction due to lack of a red sub-pixel. Thus, each pixel shares a sub-pixel of which the color is absent in said pixel with its adjacent pixel in row direction, to realize the white displaying effect jointly.

Figure 3B:
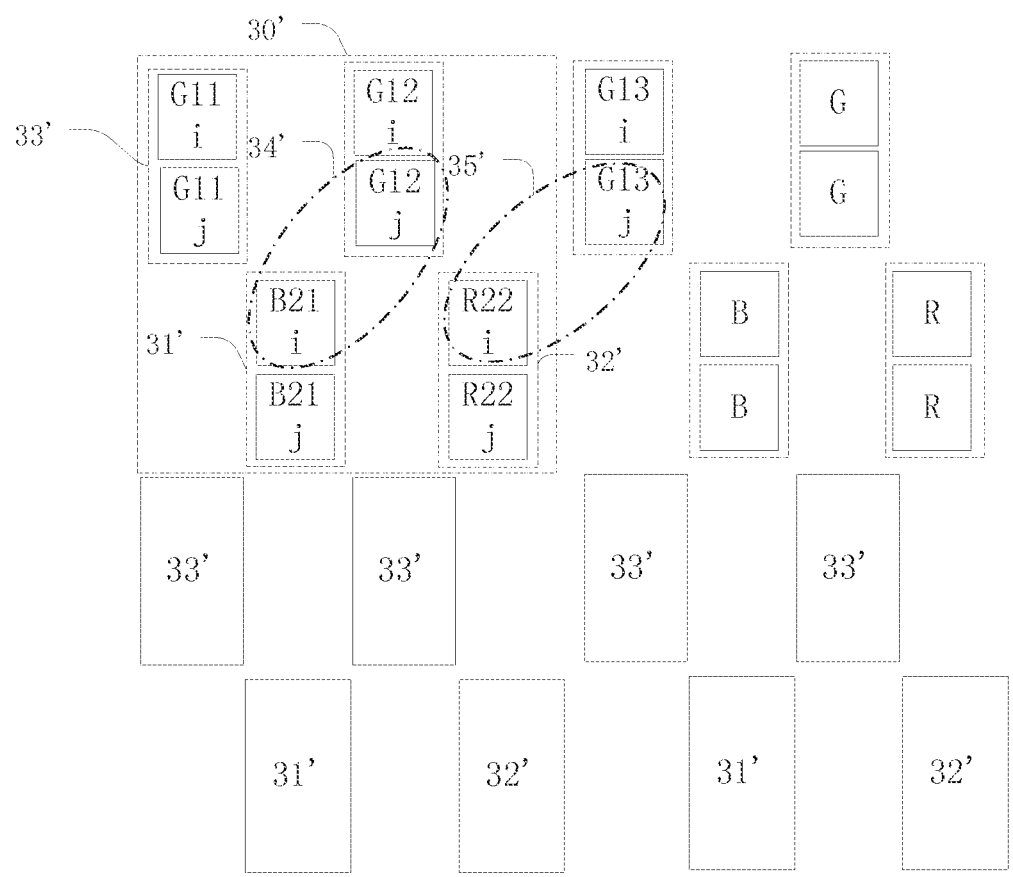
FIG. 3(b) illustrates a schematic diagram of the pixel array according to an exemplary embodiment of the disclosure.

In FIG. 3(b), the angle between the line formed by the two sub-pixels in each pixel and the row direction is for example 45 degrees. In the row direction, the lines formed by the sub-pixels in two adjacent pixels are parallel to each other. In the column direction, the lines formed by the sub-pixels in two adjacent pixels are vertical to each other. In this case, in column direction, the sub-pixel group in two adjacent rows is located at a central position between two adjacent sub-pixel groups in its upper row or lower row. The above-mentioned row is based on the sub-pixel group as a unit.

In the embodiment of FIG. 3(b), the shape of each of sub-pixels is rectangle, and the sizes of sub-pixels are same with each other. However, in the present disclosure, the shape and size of each sub-pixel are not limited thereto. For example, the shape of each of pixels can be regular hexagon, instead of circle, rectangle or rhombus. According to an embodiment, the area of a green sub-pixel G is 75%~85% of that of a blue sub-pixel B. This is due to characteristics of a green sub-pixel that a green sub-pixel can play the same role without having a same area as other sub-pixels.

Figure 3C:
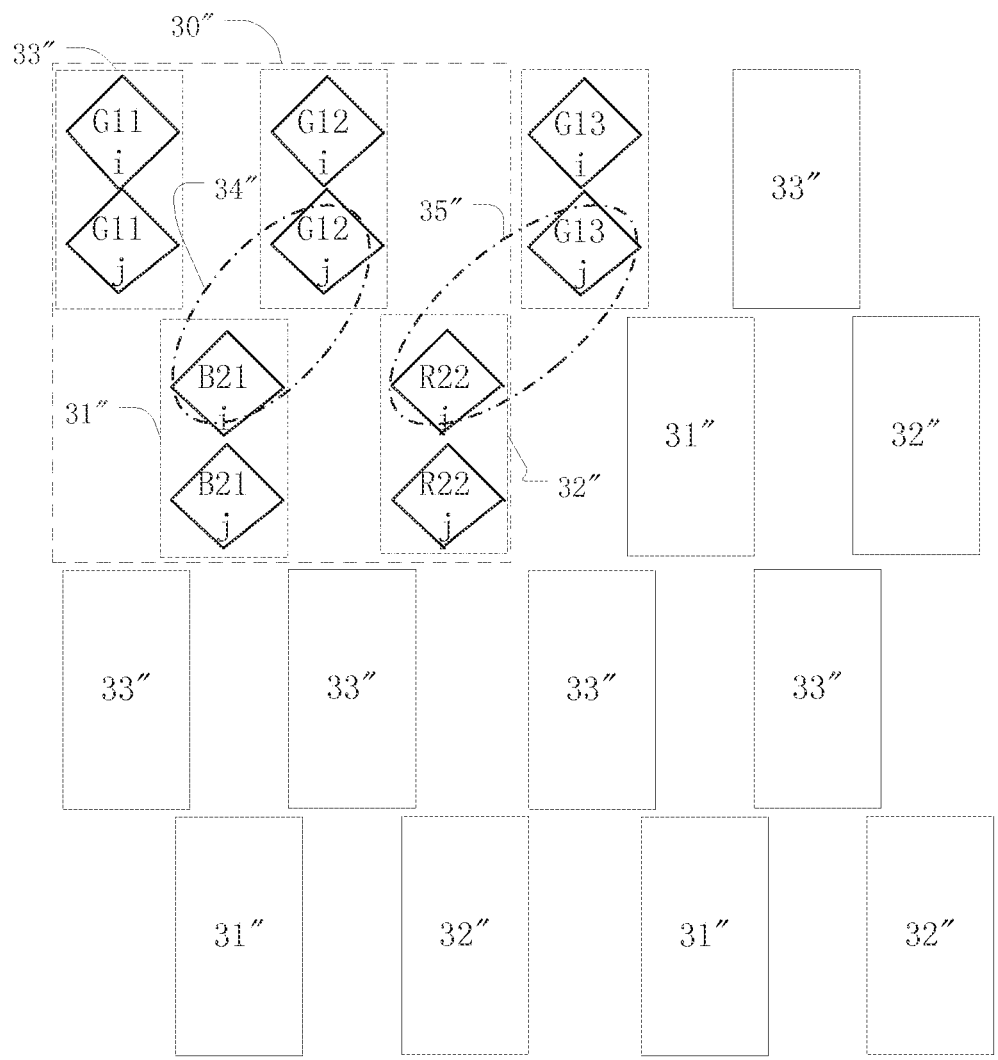
FIG. 3(c) illustrates a schematic diagram of the pixel array according to an exemplary embodiment of the disclosure.

FIG. 3(c) illustrates a schematic diagram of the pixel array according to an exemplary embodiment of the disclosure. The difference between the embodiment shown in FIG. 3(c) and that shown in FIG. 3(b) only lies in that the shapes of blue sub-pixels, red sub-pixels and green sub-pixels are all rhombus.

Figure 4A:
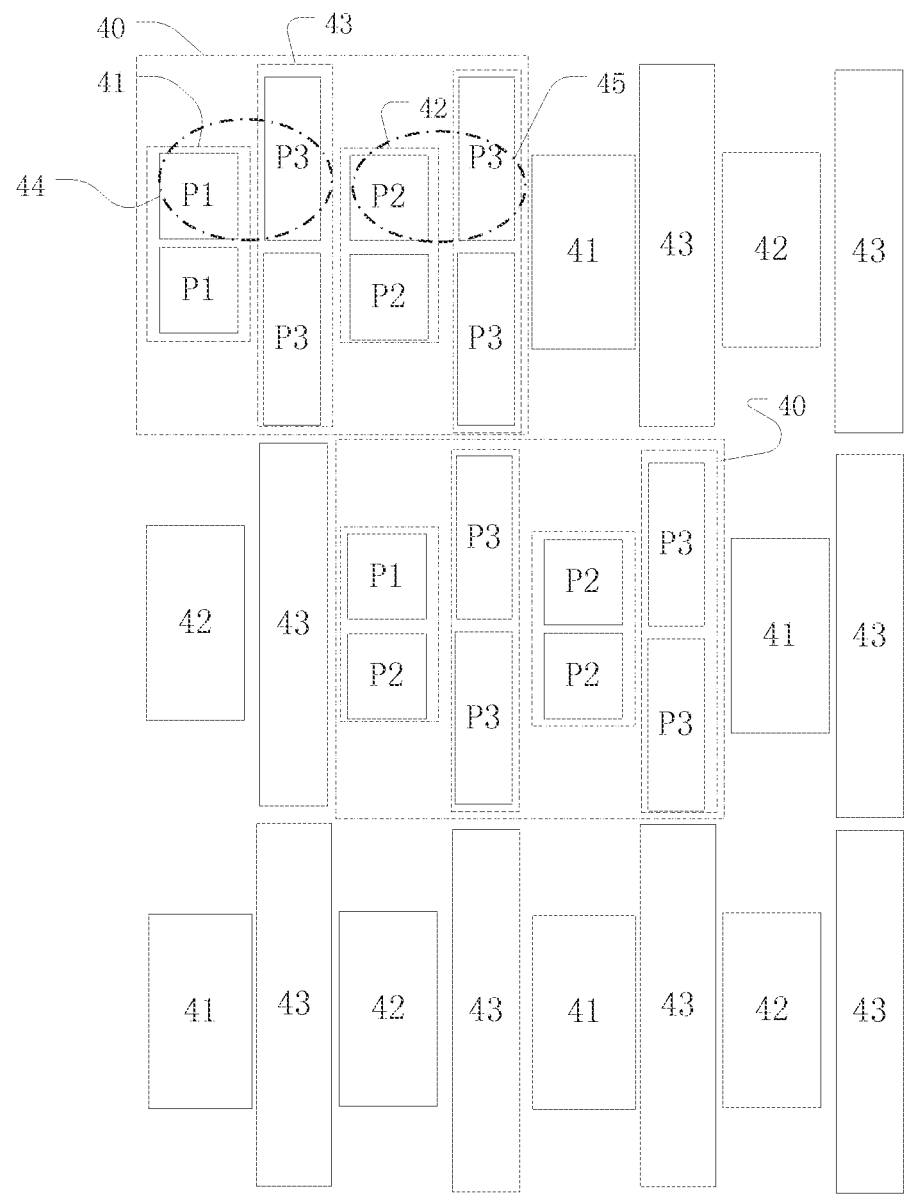
FIG. 4(a) illustrates a schematic diagram of the pixel array according to an exemplary embodiment of the disclosure.

FIG. 4(a) illustrates a schematic diagram of the pixel array according to an exemplary embodiment of the disclosure. As shown in FIG. 4(a), the pixel array is composed by a plurality of basic pixel units 40 repeated in row and column directions. Each of basic pixel unites 40 includes one first sub-pixel group 41, one second sub-pixel group 42 and two third sub-pixel group 43. Same to the embodiment shown in FIG. 3(a), two adjacent first sub-pixels P1 with the first color, between which the distance in column direction is smaller than the first predetermined value, compose a first sub-pixel group 41; two adjacent second sub-pixels P2 with the second color, between which the distance in column direction is smaller than the first predetermined value, compose a second sub-pixel group 42; two adjacent third sub-pixel P3 with the third color, between which the distance in column direction is smaller than the first predetermined value, compose a third sub-pixel group 43. For example, the first predetermined value is 10 μm in this embodiment, while in conventional manufacturing process, the distance between sub-pixels with the same color is 56 μm and the distance between sub-pixels with different colors is 26 μm.

Different from the embodiment shown in FIG. 3(a), the basic pixel unit 40 includes one row composed of one first sub-pixel group 41, one of third sup-pixels 43, one second sub-pixel group 42 and the other third sub-pixel 43 in sequence from left to right. For example, in row direction, the interval in row direction between two sub-pixel groups is larger than or equal to zero. Particularly, the above row is based on the sub-pixel group as a unit.

In detail, basic pixel units 40 are aligned in row direction. Basic pixel units are alternatively arranged in column direction at a distance of half of the width of a basic pixel unit. According to an embodiment, the first sub-pixel group 41 of a basic pixel unit 40 is aligned with the second sub-pixel group 42 of its adjacent basic pixel unit in column direction.

According to an embodiment, the interval in row direction between two sub-pixel groups, which is located correspondingly in two adjacent basic pixel units 40 in row direction of the pixel array, is larger than or equal to the width of three sub-pixels. The distance in column direction between two sub-pixel groups, which align in column directions of the pixel array, is larger than or equal to zero.

More particularly, the upper first sub-pixel P1 in the first of the first sub-pixel groups 41 counted from left in the first row and the upper third sub-pixel P3 in the first of the third sub-pixel groups 43 counted from left in the first row compose a first pixel 44 jointly. The upper second sub-pixel P2 in the first of the second sub-pixel groups 42 counted from left in the first row and the upper third sub-pixel P3 in the second of the third sub-pixel groups 43 counted from left in the first row compose a second pixel 45 jointly. Moreover, the lower first sub-pixel P1 in the first of first sub-pixel groups 41 counted from left in the first row and the lower second sub-pixel P2 in the first of the second sub-pixel groups 42 counted from left in the first row compose respectively a pixel with the lower third sub-pixel P3 in their right adjacent third sub-pixel group 43, and so on. The above pixels correspond to pixels 210 shown in FIG. 2. Since three primary colors can generate all colors, while two colors cannot generate all colors, when an image is actually displayed, one pixel may "borrow" the other color from its adjacent pixel group to compose three primary colors. If scanning is performed by column from left to right, a first pixel 44 may borrow a second sub-pixel P2 from its adjacent second pixel 45 in row direction due to lack of a second sub-pixel. Thus, each pixel shares a sub-pixel of which the color is absent in said pixel with its adjacent pixel in row direction, to realize the white displaying effect jointly.

Figure 4B:
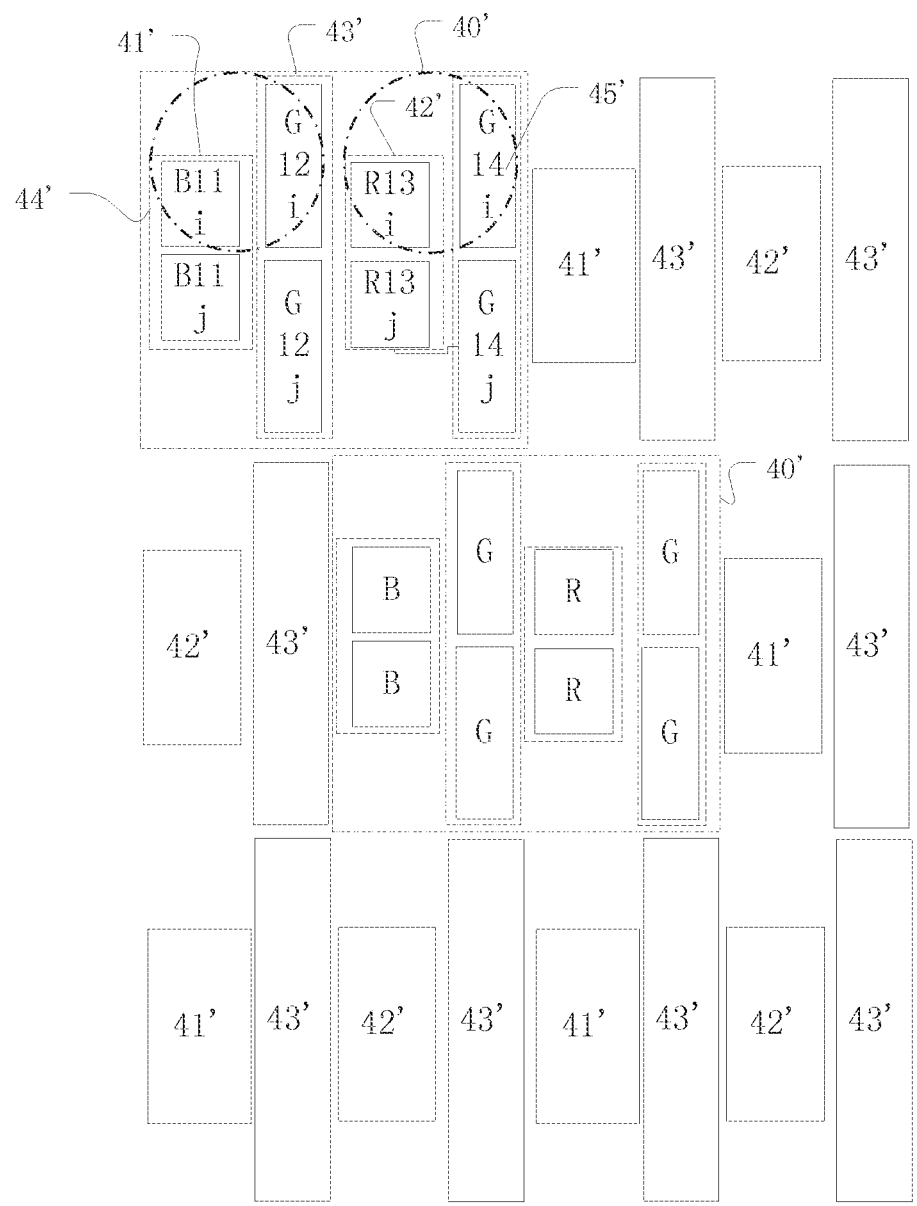
FIG. 4(b) illustrates a schematic diagram of the pixel array according to an exemplary embodiment of the disclosure.

FIG. 4(b) illustrates a schematic diagram of the pixel array according to an exemplary embodiment of the disclosure. As shown in FIG. 4(b), the pixel array is composed of a plurality of basic pixel units 40 repeated in row and column direction. Each of the basic units 40' includes: a first sub-pixel group 41', a second sub-pixel group 42' and two third sub-pixel groups 43'. Same to the embodiment shown in FIG. 3(b), two adjacent blue sub-pixels B, between which the distance in column direction is smaller than the first predetermined value, compose a first sub-pixel group 41'; two adjacent red sub-pixels R, between which the distance in column direction is smaller than the first predetermined value, compose a second sub-pixel group 42'; two adjacent green sub-pixels G, between which the distance in column direction is smaller than the first predetermined value, compose a third sub-pixel group 43'. For example, the first predetermined value is 10 μm in this embodiment, while in conventional manufacturing process, the distance between sub-pixels with the same color is 56 μm and the distance between sub-pixels with different colors is 26 μm.

The difference between the present embodiment and embodiment shown in FIG. 3(b) lies in the arrangement of pixel array. Blue sub-pixels as a first sub-pixel with the first color compose a first sub-pixel group 41', red sub-pixels as a second sub-pixel with the second color compose a second sub-pixel group 42', and green sub-pixels G as a third sub-pixel with the third color compose a third sub-pixel group 43'. The arrangement of the pixel array shown in FIG. 4(*b*) is similar to that of the pixel array shown in FIG. 4(*a*), which is not described herein for conciseness.

More particularly, the upper blue sub-pixel B11*i* in the first of the first sub-pixel groups 41' counted from left in the first row and the upper green sub-pixel G12*i* in the first of the third sub-pixel groups 43' counted from left in the first row compose a first pixel 44' jointly. The upper red sub-pixel R13*i* in the first of the second sub-pixel groups 42' counted from left in the first row and the upper green sub-pixel G14*i* in the second of the third sub-pixel groups 43' counted from left in the first row compose a second pixel 45' jointly. Moreover, the lower blue sub-pixel B11*j* in the first of the first sub-pixel groups 41' counted from left in the first row and the lower red sub-pixel R13*j* in the first of the second sub-pixel groups 42' counted from left in the first row compose a pixel respectively with the lower green sub-pixel G12*j* and 14*j* in their right adjacent third sub-pixel group 43', and so on. The above pixels correspond to pixels 210 shown in FIG. 2. Since three primary colors can generate all colors, while two colors can not generate all colors, so when an image is actually displayed, one pixel may "borrow" the other color from its adjacent pixel group to compose three primary colors. If scanning is performed by column and from left to right, a first pixel 44' may borrow a red sub-pixel R13*i* from its adjacent second pixel 45' in row direction due to lack of a red sub-pixel. Thus, each pixel shares a sub-pixel of which the color is absent in said pixel with its adjacent pixel in row direction, to realize the white displaying effect jointly.

Figure 4C:
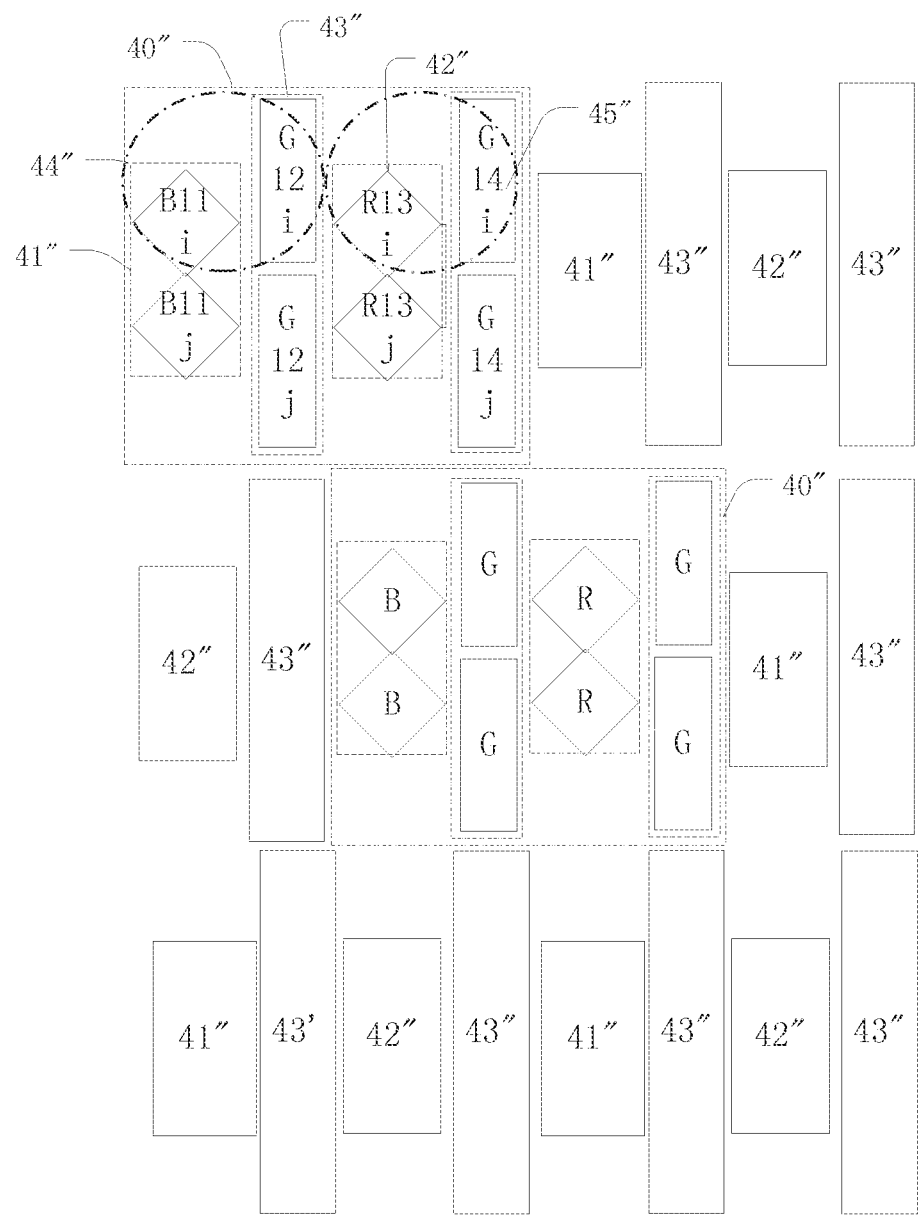
FIG. 4(c) illustrates a schematic diagram of the pixel array according to an exemplary embodiment of the disclosure.

In FIG. 4(*b*), the angle between the line formed by two sub-pixels in each pixel and row direction is for example 0 degree. The sub-pixels in two adjacent pixels in row direction are in a line. The lines formed by the sub-pixels in two adjacent pixels in column direction are parallel to each other.

In the embodiment shown in FIG. 4(*b*), the shape of each of sub-pixels is rectangle, and the size of one blue sub-pixel B is equal to that of one red sub-pixel R. However, the height of one green sub-pixel G is larger than that of one blue sub-pixel B and that of one red sub-pixel R, and the width of one green sub-pixel G is smaller than that of one blue sub-pixel B and that of one red sub-pixel R. According to an embodiment, the area of one green sub-pixel G is 75%~85% of that of one blue sub-pixel B. But in the present disclosure, the shape and size of each of sub-pixels are not limited thereto. For example, the shape of each of pixels can be regular hexagon, instead of circle, rectangle or rhombus.

FIG. 4(*c*) illustrates a schematic diagram of the pixel array according to an exemplary embodiment of the disclosure. The difference between the embodiment shown in FIG. 4(*c*) and that shown in FIG. 4(*b*) only lies in that the shapes of blue sub-pixels and red sub-pixels are rhombus, and green sub-pixels are rectangle.

Figure 5A:
FIG. 5(a) illustrates a schematic diagram of the pixel array according to an exemplary embodiment of the disclosure.
Figure 5B:
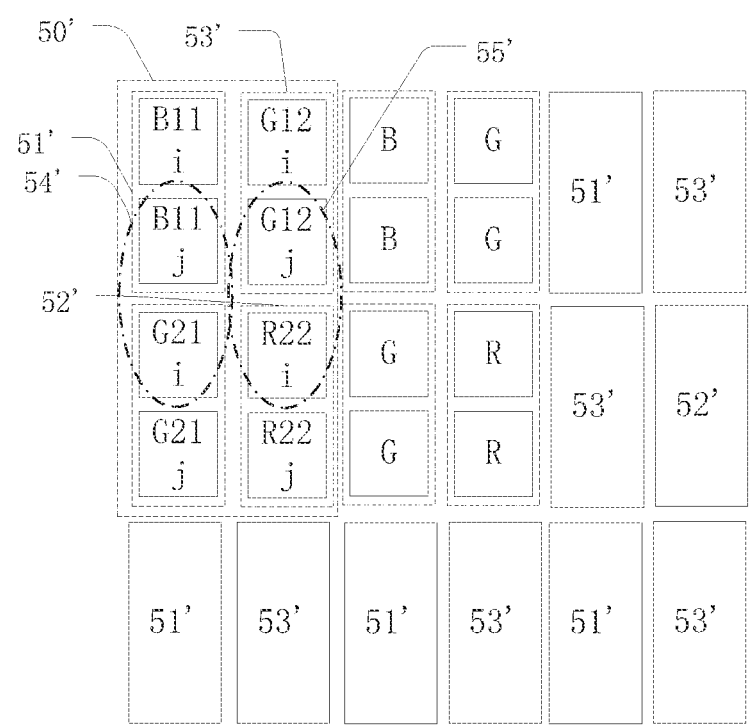
FIG. 5(b) illustrates a schematic diagram of the pixel array according to an exemplary embodiment of the disclosure.
Figure 5C:
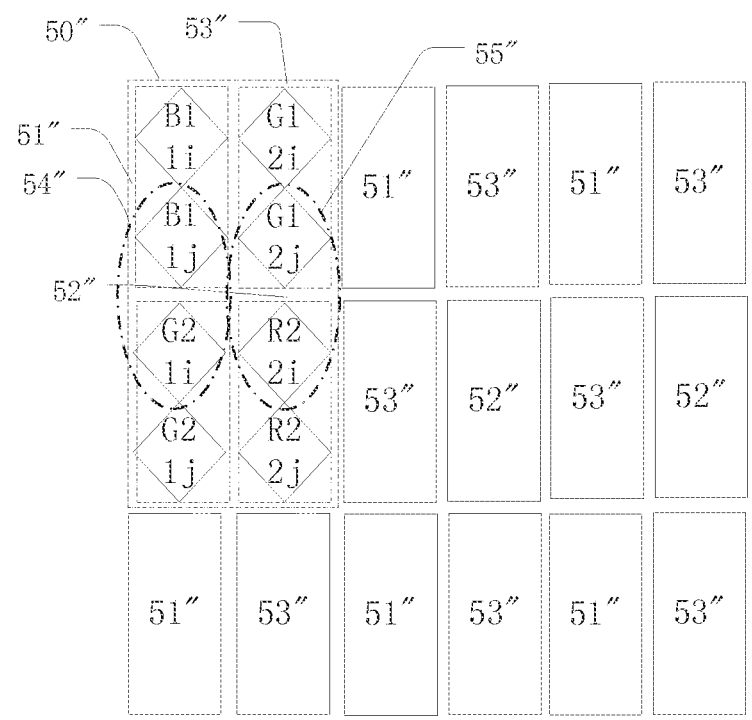
FIG. 5(c) illustrates a schematic diagram of the pixel array according to an exemplary embodiment of the disclosure.

FIG. 5(*a*) illustrates a schematic diagram of the pixel array according to an exemplary embodiment of the disclosure. As FIG. 5(*a*) shown, the pixel array is composed of a plurality of basic pixel units 50 repeated in row and column direction. Each of the basic pixel units 50 includes: a first sub-pixel group 51, a second sub-pixel group 52 and two third sub-pixel groups 53. Same to the embodiment shown in FIG. 3(*a*), two adjacent first sub-pixels P1 with the first color, between which the distance in column direction is smaller than the first predetermined value, compose a first sub-pixel group 51; two adjacent second sub-pixels P2 with the second color, between which the distance in column direction is smaller than the first predetermined value, compose a second sub-pixel group 52; two adjacent third sub-pixel P3 with the third color, between which the distance in column directions is smaller than the first predetermined value, compose a third sub-pixel group 53. For example, the first predetermined value is 10 μm in this embodiment, while in conventional manufacturing process, the distance between sub-pixels with the same color is 56 μm and the distance between sub-pixels with the different color is 26 μm.

Different from the embodiment shown in FIG. 3(*a*), a basic pixel unit 50 includes from top to bottom: a first row composed of one first sub-pixel group 51 and one third sub-pixel group 53 from left to right, wherein, the first sub-pixel group 51 is located at the first column of the basic pixel unit 50, and the third sub-pixel group 53 is located at the second column of the basic pixel unit 50; and a second row composed of the other third sub-pixel group 53 and one second sub-pixel group 52, wherein, the third sub-pixel group 53 is located at the first column of the basic pixel unit 50, and the second sub-pixel group 52 is located at the second column of the basic pixel unit 50. For example, the first row is aligned with the second row in column direction, and the first column is aligned with the second column in row direction. In detail, the above rows and columns are based on the sub-pixel group as a unit.

For example, the spacing between two adjacent sub-pixel groups in row or column direction is larger than or equal to zero.

According to an embodiment, adjacent basic pixel units 50 are aligned with each other in row and column direction. The distance in row direction between two sub-pixel groups, which are located correspondingly in two adjacent basic pixel units 50 in row direction of the pixel array, is larger than or equal to the width of a sub-pixel. The distance in column direction between two sub-pixel groups, which are located correspondingly in two adjacent basic pixel units 50 in column direction of the pixel array, is larger than or equal to the height of a sub-pixel.

More particularly, the lower first sub-pixel P1 in the first of the first sub-pixel groups 51 counted from left in the first row and the upper third sub-pixel P3 in the first of the third sub-pixel groups 53 counted from left in the second row compose a first pixel 54 jointly. The lower third sub-pixel P3 in the first of the third sub-pixel groups 53 counted from left in the first row and the upper second sub-pixel P2 in the first of the second sub-pixel groups 52 counted from left in the second row compose a second pixel 55 jointly. The above pixels correspond to pixels 210 shown in FIG. 2. Since three primary colors can generate all colors, while two colors cannot generate all colors, when an image is actually displayed, one pixel may "borrow" the other color from its adjacent pixel group to compose three primary color. If scanning is performed by column from left to right, a first pixel 54 may borrow a second sub-pixel P2 from its adjacent second pixel 55 in row direction due to lack of a second sub-pixel. Thus, each pixel shares a sub-pixel of which the color is absent in said pixel with its adjacent pixel in row direction, to realize the white displaying effect jointly.

FIG. 5(*b*) illustrates a schematic diagram of the pixel array according to an exemplary embodiment of the disclosure. As shown in FIG. 5(*b*), the pixel array is composed by a plurality of basic pixel units 50 repeated in row and column directions. Each of the basic units 50' includes: a first sub-pixel group 51', a second sub-pixel group 52' and two third sub-pixel groups 53'. Same to the embodiment shown in FIG. 3(*b*), two adjacent blue sub-pixels B, between which the distance in column direction is smaller than the first predetermined value, compose a first sub-pixel group 51'; two adjacent red sub-pixels R, between which the distance in column direction is smaller than the first predetermined value, compose a second sub-pixel group 52'; two adjacent green sub-pixels G, between which the distance in column direction is smaller than the first predetermined value, compose a third sub-pixel group 53'. For example, the first predetermined value is 10 μm in this embodiment, while in conventional manufacturing process, the distance between sub-pixels with the same color is 56 μm and the distance between sub-pixels with the different color is 26 μm.

The difference between this embodiment and that shown in FIG. 3(*b*) lies in the arrangement of pixel array. Blue sub-pixels as a first sub-pixel with the first color compose a first sub-pixel group 51', red sub-pixels as a second sub-pixel with the second color compose a second sub-pixel group 52', and green sub-pixels G as a third sub-pixel with the third color compose a third sub-pixel group 53'. The arrangement of the pixel array shown in FIG. 5(*b*) is similar to that of the pixel array shown in FIG. 5(*a*), which is not described here for conciseness.

More particularly, the lower blue sub-pixel B11*j* in the first of the first sub-pixel groups 51' counted from left in the first row and the upper green sub-pixel G21*i* in the first of the third sub-pixel group 53' counted from left in the second row compose a first pixel 54' jointly. The lower green sub-pixel G21*j* in the first of the third sub-pixel groups 53' counted from left in the first row and the upper red sub-pixel R22*i* in the first of the second sub-pixel groups 52' counted from left in the second row compose a second pixel 55' jointly. The above pixels correspond to pixels 210 shown in FIG. 2. Since three primary colors can generate all colors, and two colors cannot generate all colors, so when an image is actually displayed, one pixel may "borrow" the other color from its adjacent pixel group to compose three primary color. If scanning is performed by column and from left to right, a first pixel 54' may borrow a red sub-pixel R22*i* from its adjacent second pixel 55' in row direction due to lack of a second sub-pixel. Thus, each pixel shares a sub-pixel of which the color is absent in said pixel with its adjacent pixel in row direction, to realize the white displaying effect jointly.

In FIG. 5(*b*), the angle between the line formed by two sub-pixels in each pixel and row direction is for example 90 degree. The lines formed by the sub-pixels in two adjacent pixels in row direction are parallel. The sub-pixels in two adjacent pixels in column direction are in a line.

In the embodiment shown in FIG. 5(*b*), the shape of each of sub-pixels is rectangle, and the sizes of one blue sub-pixel B, one red sub-pixel R and one green sub-pixel G are same with each other. But in the present disclosure, the shape and size of each of sub-pixels are not limited thereto. For example, the shape of each of pixels can be regular hexagon, instead of circle, rectangle or rhombus. According to an embodiment, the area of one green sub-pixel G is 75%~85% of that of one blue sub-pixel B. This is due to characteristics of a green sub-pixel that a green sub-pixel can play the same role without having a same area as other sub-pixels.

FIG. 5(*c*) illustrates a schematic diagram of the pixel array according to an exemplary embodiment of the disclosure. The difference between this embodiment and the embodiment shown in FIG. 5(*b*) only lies in that the shapes of blue sub-pixels, red sub-pixels and green sub-pixels are all rhombus.

The display according the embodiment of the disclosure includes: a substrate, an organic light emitting diode and a driver. The substrate has a pixel region and a non-pixel region. The organic light emitting diode includes a first electrode, an organic film and a second electrode in the pixel region. The driver is used to drive the organic light emitting diode. The pixel array in the pixel region of the display according to the embodiment of the disclosure may be any one of the pixel arrays according the embodiment of the disclosure shown in FIG. 3(*a*)~FIG. 5(*c*).

Figure 6:
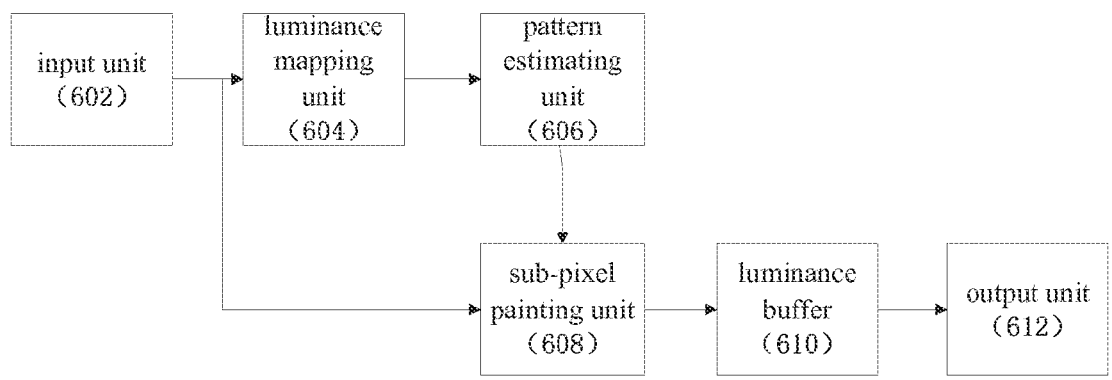
FIG. 6 illustrates the driver for rendering color images on a display according to the disclosure.

FIG. 6 illustrates the driver 600 displaying color images on a display according to the disclosure. The driver 600 includes: an input unit 602, a luminance mapping unit 604, a pattern estimating unit 606, a sub-pixel painting unit 608, a luminance buffer 610 and an output unit 612. The input unit 602 inputs an image signal. The image signal represents a color image to be rendered in the display. The luminance mapping unit 604 generates a luminance map of the color image. The luminance map includes the luminance values of each red, green and blue. The pattern estimating unit 606 analyzes the luminance map to estimate at least one pattern of the color image. The at least one pattern of this color image includes at least one of a dot pattern, a vertical line, a horizontal line and a diagonal line. The pattern estimating unit 606 also generates at least one color template for each pattern. The pixel painting unit 608 generates an intensity map according to at least one color template, and outputs this intensity map to the luminance buffer 610. The intensity map comprises intensity values of each of first sub-pixels, second sub-pixels and third sub-pixel of the display. The output unit 612 outputs multiple voltage signals generated according to the intensity map to the display.

The driver 600 also may be configured to generate directly an intensity map according to input image signals, without the luminance mapping unit 604 and the pattern estimating unit 606.

The pixel arrays according to the embodiments of the disclosure may generate various kinds of color templates. A color template may be decided by the color of a dot pattern, to display various patterns in an image. Each of the first luminance value, the second luminance value and the third luminance value is a ratio of the gray-scale value (luminance) of the respective color to its maximum gray-scale value, which is denoted by a percentage within a range of 0%~100%. For example, for a n-bit gray-scale value of a color, the value of this gray scale is from 0 representing no such a color up to $(2^n-1)$ representing the full color. The former has a luminance value of 0%, and the latter has a luminance value of 100% for this color. A luminance value may be based on a 8-color-bit gray-scale value, i.e. the values are 0, 1, 2, . . . , 254 to 255. It shall be understood that other gray-scale value in different bits also can be used to implement the disclosure. The grayscale value refers to various gray value for an image, or an amount of light perceived by human eyes for the image. If the luminance of the color image is expressed by n-bit gray value, wherein n is an integer larger than 0, then the gray scale values are from "0" representing black up to "$2^n-1$" representing white, and the other values between them represent gradually increasing gray scales.

For example, in order to display a white dot pattern, the color template may include: a green luminance value about 100%; a blue luminance value ranging from about 50% to about 100%; and a red luminance value ranging from about 50% to about 100%. In order to display a red dot pattern, a color template may include: a green luminance value ranging from about 1% to about 20%; a blue luminance value ranging from about 0% to about 50%; and a red luminance value ranging from about 50% to about 100%. In order to display a green dot pattern, a color template may include: a green luminance value of 100%; a blue luminance value ranging from about 0% to about 50%; and a red luminance value ranging from about 1% to about 30%. In order to display a blue dot pattern, a color template may include: a green luminance value ranging from about 1% to about 20%; a blue luminance value ranging from about 50% to about 100%; and a red luminance value ranging from about 0% to about 30%.

Figure 7:
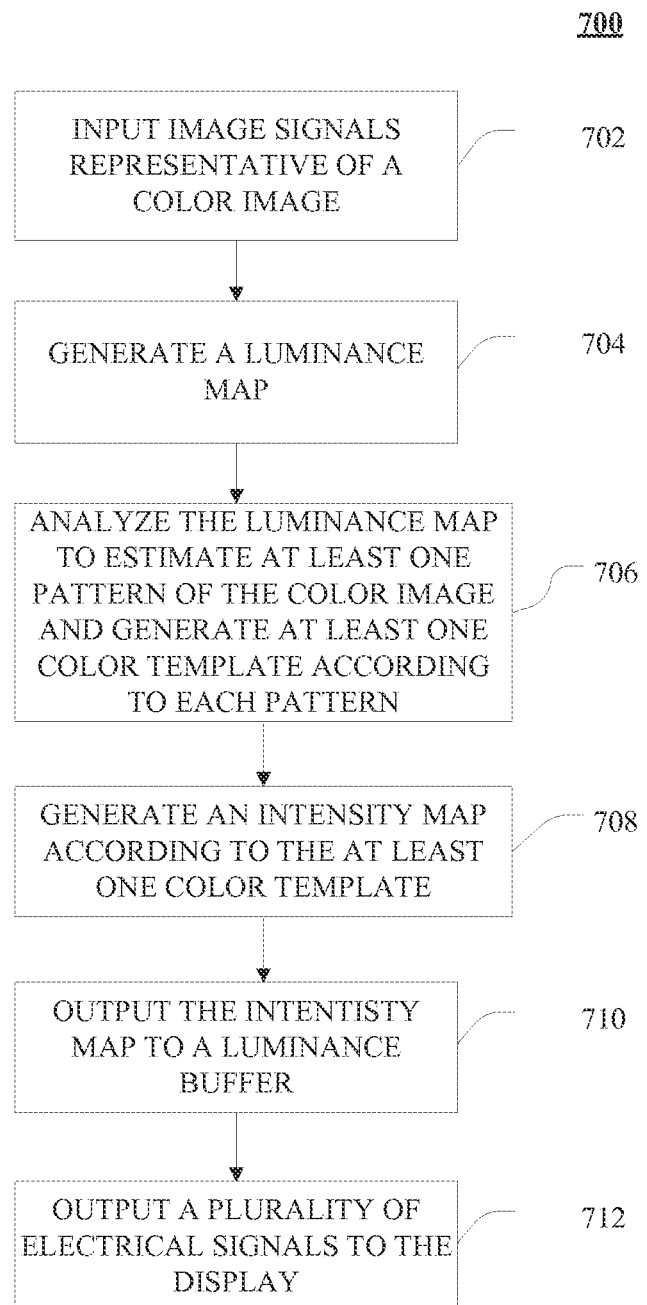
FIG. 7 illustrates the method for rendering images on a display according to the disclosure.

FIG. 7 illustrates the method 700 for displaying images on a display according to the disclosure. The method 700 may include the below steps.

At step 702, image signals are input. The image signals may be image signals representative of a color image, for example.

At step 704, a luminance map is generated according to the input image signals. The luminance map includes luminance values of each red sub-pixel, each green sub-pixel and each blue sub-pixel.

At step 706, the luminance map is analyzed to estimate at least one pattern of the color image, and at least one color template is generated according to each pattern. The color template has a plurality of sub-pixels and each of the at least one color template corresponds to the at least one pattern of the color image.

At step 708, an intensity map is generated according to the at least one color template. The intensity map includes intensity values of each first sub-pixel, each second sub-pixel and each third sub-pixel of the display.

At step 710, the intensity map is output to a luminance buffer.

At step 712, a plurality of electrical signals generated according to the intensity map is output to the display.

The method 700 may also be configured to generate the at least one color template directly from the input image signals without steps 704 and 706.

One of ordinary skill in this art shall appreciate that modifications and variations without departing from the spirit and scope of the present disclosure as disclosed by appended claims shall fall within the protection scope of claims of the present disclosure.

What is claimed is:

1. A pixel array composed of a plurality of basic pixel units arranged in row and column directions, wherein, each of the basic pixel units consists of:
   a first sub-pixel group composed of two adjacent first sub-pixels, wherein each of the two adjacent first sub-pixels has a first color, and distance between the two adjacent first sub-pixels in row or column direction is smaller than a first predetermined value;
   a second sub-pixel group composed of two adjacent second sub-pixels, wherein, each of the two adjacent second sub-pixels has a second color, and distance between the two adjacent second sub-pixels in row or column direction is smaller than the first predetermined value; and
   two third sub-pixel groups, each of which is composed of two adjacent third sub-pixels, wherein, each of the two adjacent third sub-pixels has a third color, and distance between the two adjacent third sub-pixels in row or column direction is smaller than the first predetermined value;
   wherein, the two adjacent third sub-pixel groups are arranged at a first row, the first of the two adjacent third sub-pixel groups is located at a first column, and the other is located at a third column; and the first sub-pixel group and the second sub-pixel group are arranged at a second row, wherein, the first sub-pixel group is located at a second column, and the other is located at a fourth column.

2. The pixel array of claim 1, wherein,
   the second row is offset from the first row at a distance smaller than or equal to a width of the third sub-pixel,
   the two third sub-pixel groups are aligned with each other in row direction, the first sub-pixel group is aligned with the second sub-pixel group in row direction, a distance between the first of the two third sub-pixel groups and the first sub-pixel group in column direction is larger than or equal to zero.

3. The pixel array of claim 2, wherein, a distance between the two third sub-pixel groups of the first row is smaller than or equal to the width of the first sub-pixel, and a distance between the first sub-pixel group and the second sub-pixel group of the second row is smaller than or equal to the width of the third sub-pixel.

4. The pixel array of claim 3, wherein, the plurality of basic pixel units are aligned in row and column to compose the pixel array.

5. The pixel array of claim 4, wherein, a distance between two corresponding third sub-pixel group of two adjacent basic pixel units in row direction is smaller than or equal to a combination of widths of the first, the second and the third sub-pixels.

6. The pixel array of claim 5, wherein, an interval between two corresponding third sub-pixel groups of two adjacent basic pixel units in column direction is larger than or equal to either height of the first sub-pixel group and the second sub-pixel group.

7. The pixel array of claim 1, wherein, the first predetermined value is 10 μm.

8. The pixel array of claim 1, wherein, the two first sub-pixels composing the first sub-pixel group are aligned with each other in column direction;
   the two second sub-pixels composing the second sub-pixel group are aligned with each other in column direction; and
   the two third sub-pixels composing the third sub-pixel group are aligned with each other in column direction.

9. The pixel array of claim 1, wherein, the first sub-pixel, the second sub-pixel or the third sub-pixel has a rectangular shape, a circular shape, a rhombus shape or a regular hexagonal shape.

10. The pixel array of claim 1, wherein, the first color, the second color and the third color are blue, red and green, respectively.

11. The pixel array of claim 1, wherein, a row composed of sub-pixels with a same color in the pixel array is provided with signals from a scanning driver, and a column composed of sub-pixels with different colors is provided with signals from a data driver.

* * * * *